US007190079B2

(12) United States Patent
Andricacos et al.

(10) Patent No.: US 7,190,079 B2
(45) Date of Patent: Mar. 13, 2007

(54) SELECTIVE CAPPING OF COPPER WIRING

(75) Inventors: Panayotis C. Andricacos, Croton-On-Hudson, NY (US); Shyng-Tsong Chen, Patterson, NY (US); John M. Cotte, New Fairfield, CT (US); Hariklia Deligianni, Tenafly, NJ (US); Mahadevaiyer Krishnan, Hopewell Junction, NY (US); Wei-Tsu Tseng, Hopewell Junction, NY (US); Philippe M. Vereecken, Leuven (BE)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 11/265,302

(22) Filed: Nov. 3, 2005

(65) Prior Publication Data
US 2006/0076685 A1    Apr. 13, 2006

Related U.S. Application Data

(62) Division of application No. 10/611,931, filed on Jul. 3, 2003, now Pat. No. 7,008,871.

(51) Int. Cl.
*H01L 23/52* (2006.01)
*H01L 23/48* (2006.01)
*H01L 29/40* (2006.01)

(52) U.S. Cl. ............ 257/774; 257/758; 257/762; 438/669; 438/652
(58) Field of Classification Search ........ 257/E21.174, 257/E21.584, E21.585, 762, 758, 774; 438/669, 438/652
See application file for complete search history.

(56) References Cited

U.S. PATENT DOCUMENTS 5,374,454 A    12/1994   Bickford et al.
5,380,546 A     1/1995   Krishnan et al.

(Continued)

OTHER PUBLICATIONS

Hu et al., "Chemical Vapor Deposition Copper Interconnections and Electromigration," Elecrochemical Society Proceedings, vol. 97-25, 1997, pp. 1514-1522.

(Continued)

*Primary Examiner*—Kenneth Parker
*Assistant Examiner*—Chris C. Chu
(74) *Attorney, Agent, or Firm*—Connolly, Bove, Lodge & Hutz, LLP; Robert Trepp

(57) ABSTRACT

Patterned copper structures are fabricated by selectively capping the copper employing selective etching and/or selective electroplating in the presence of a liner material. Apparatus for addressing the problem of an increased resistive path as electrolyte during electroetching and/or electroplating flows from the wafer edge inwards is provided.

9 Claims, 10 Drawing Sheets

U.S. PATENT DOCUMENTS

| | | | |
|---|---|---|---|
| 5,486,282 A | 1/1996 | Datta et al. | |
| 5,723,387 A | 3/1998 | Chen | |
| 5,865,984 A | 2/1999 | Corbin, Jr. et al. | |
| 6,017,803 A | 1/2000 | Wong | |
| 6,130,157 A * | 10/2000 | Liu et al. | 438/669 |
| 6,157,081 A * | 12/2000 | Nariman et al. | 257/752 |
| 6,171,960 B1 | 1/2001 | Lee | |
| 6,191,029 B1 * | 2/2001 | Hsiao et al. | 438/633 |
| 6,239,021 B1 * | 5/2001 | Pramanick et al. | 438/627 |
| 6,251,774 B1 | 6/2001 | Harada et al. | |
| 6,258,713 B1 | 7/2001 | Yu et al. | |
| 6,261,963 B1 | 7/2001 | Zhao et al. | |
| 6,274,499 B1 | 8/2001 | Gupta et al. | |
| 6,281,127 B1 | 8/2001 | Shue | |
| 6,333,560 B1 | 12/2001 | Uzoh | |
| 6,339,258 B1 | 1/2002 | Cooney, III et al. | |
| 6,350,687 B1 | 2/2002 | Avanzino et al. | |
| 6,368,484 B1 | 4/2002 | Volant et al. | |
| 6,372,633 B1 * | 4/2002 | Maydan et al. | 438/637 |
| 6,395,607 B1 | 5/2002 | Chung | |
| 6,406,996 B1 * | 6/2002 | Bernard et al. | 438/653 |
| 6,441,492 B1 | 8/2002 | Cunningham | |
| 6,524,957 B2 * | 2/2003 | Merchant et al. | 438/687 |
| 6,528,409 B1 * | 3/2003 | Lopatin et al. | 438/618 |
| 6,537,913 B2 * | 3/2003 | Modak | 438/687 |
| 6,670,274 B1 | 12/2003 | Liu et al. | |
| 6,696,758 B2 * | 2/2004 | Dubin et al. | 257/750 |
| 6,730,982 B2 * | 5/2004 | Barth et al. | 257/529 |
| 2001/0019892 A1 * | 9/2001 | Komai et al. | 438/687 |
| 2004/0224474 A1 * | 11/2004 | Barth et al. | 438/396 |

OTHER PUBLICATIONS

Hu et al., "Electromigration in On-Chip Single/Dual Damascene Cu Interconnections," Journal of The Electrochemical Society, 149 (7) 2002, pp. G408-G415.

Rosenberg et al., "Scaling Effect on Electromigration in On-Chip Cu Wiring," IEEE, 1999, pp. 267-269.

Uzoh et al., "A High Performance Liner for Copper Damascene Interconnects," IEEE, 2001, pp. 9-11.

Ramani et al., "Synthesis and Characterizaiton of Hydrous Ruthenium Oxide-Carbon Supercapacitors," Journal of The Electrochemical Society, 148 (4), 2001, pp. A374-A380.

* cited by examiner

As Plated

Z-range: 35nm
RMS: 3.3nm

4 Volts

Z-range: 64nm
RMS: 4.9nm

6 Volts

Z-range: 33nm
RMS: 3.6nm

SELECTIVE CAPPING OF COPPER WIRING

This application is a divisional of U.S. patent application Ser. No. 10/611,931, filed Jul. 3, 2003, now U.S. Pat. No. 7,008,871, issued Mar. 7, 2006.

TECHNICAL FIELD

The present invention relates to fabricating patterned copper structures and particularly patterned copper structures wherein the copper is in contact with a liner material. The present invention is concerned with selectively capping the copper employing selective etching and/or selective electroplating. The present invention also relates to apparatus suitable for depositing the capping material on the copper.

BACKGROUND OF INVENTION

Copper wiring for on-chip interconnections, currently fabricated by a (single or dual) Damascene integration approach, is surrounded on the sides and at the bottom by a liner or barrier (e.g.—Ta, W, nitrides thereof and multilayers thereof), whose role is to prevent Cu diffusion into the interlayer dielectric material (ILD) (e.g. $SiO_2$ and low k dielectrics) and to provide excellent adhesion between the Cu conductor and the ILD. Additionally, the liner prevents the diffusion of $O_2$ or other substances into the Cu conductor. The diffusion of such materials would cause chemical changes to the conductor and adversely affect its resistivity and other properties. Recent work by Hu et al., "Electromigration in On-Chip Single/Dual Damascene Cu Interconnections", J. Electrochem. Soc., 149, G408 (2002); and Hu et al. "Scaling Effect on Electromigration in On-Chip Cu Wiring", Proc. IITC (1999) p. 267; C.-K. Hu and S. Reynolds, "CVD Cu Interconnections and Electromigration", Electrochem. Soc. Proc. Vol. 97–25 (1997), p. 1514, has shown that surface diffusion is a predominant way for Cu to electromigrate; it is therefore evident that good adhesion of the Cu conductor to the liner helps suppress electromigration. Materials such as Ta/TaN bilayers have been shown to be excellent diffusion barriers and to provide excellent adhesion and electromigration suppression. For example, see Edelstein, et al. "A High Performance Liner for Copper Damascene Interconnects," Proceedings of the 2001 IEEE IITC, pp 9–11, (2001).

Providing an appropriate capping material on the copper suppresses electromigration of the copper conductor material. Although Damascene integration provides a facile way to protect Cu conductors on the side and at the bottom, it does not provide a satisfactory solution at the top of the structure.

Capping the top of these structures poses more of a challenge due to the desire for planarity between layers in fabricating a multilayer interconnects structure. Electroless plating has been demonstrated to selectivity deposit on the interconnect; however, this approach offers only a limited set of materials and lacks planarity between layers. Also, presently, to suppress Cu diffusion or electromigration from the top, a blanket film of a material such as $Si_xN_y$, is deposited after the Cu and surrounding ILD is planarized and before the subsequent layer of metallization is built (FIG. 1). Although such layers have proven adequate for past generation of processors, the drive towards reduction of the effective interlayer dielectric constant and increased protection against electromigration suggest that new materials and integration approaches should be developed that are selectively deposited on top of the Cu conductors (FIG. 1). It is apparent that blanket films, even if they address the electromigration and diffusion problems, may cause an unacceptable increase in the overall dielectric constant of the structure.

Accordingly, the present invention relates to improved methods and apparatus for selectively capping copper.

SUMMARY OF THE INVENTION

The present invention relates to addressing problems of capping of copper. In particular, one aspect of the present invention is concerned with a method for fabricating patterned copper structures which comprises providing a dielectric material on a substrate; providing at least one trench/via in the dielectric material; providing a liner on the bottom and sidewalls of the at least one trench/via and on horizontal surfaces of the dielectric material in the vicinity of the at least one trench/via; depositing copper in the at least one trench/via/via on the liner for filling the trench/via; selectively electroetching or selectively chemically etching the copper to recess the copper with respect to the top surfaces of the structure.

Another aspect of the present invention relates to a patterned copper structure comprising a substrate having a dielectric material on the substrate wherein the dielectric material contains at least one trench/via therein;

located on the bottom and sidewalls a liner of the at least one trench/via;

copper located on the liner in the at least one trench/via; and a capping structure located directly on top of the copper and comprising a first metal or alloy layer selected from the group consisting of Co, CoP, CoWP, CoMoP, Ni, NiP, NiWP, NiMoP, NiW, NiMo, CoMo, NiFe, CoFe, NiFeP, CoFeP, NiB, CoB, NiFeB, CoFeB, NiCo, NiCoP, NiCoB, NiWB, NiMoB, CoWB, CoMoB, CoV, NiV, CoFeV, NiFeV, NiCoV, NiCoFeV, NiCo; and a second metal or alloy layer selected from the group consisting of Ru, Re, Pt, Pd, Rh, Os, NiPd, CoPd, Pb, Sn, Sb, and In.

A still further aspect of the present invention related to a patterned upper structure comprising a substrate having a dielectric material on the substrate wherein the dielectric material contains at least one trench/via/via therein;

located on the bottom and sidewalls a liner of the at least one trench/via;

copper located on the liner in the at least one trench/via; and a capping structure located on top of the copper and comprising a layer containing ruthenium, rhenium, osmium, and rhodium.

A still further aspect of the present invention relates to a method for fabricating patterned copper structures, which comprises providing a dielectric material on a substrate;

providing a liner on the bottom and sidewalls of the at least one trench/via and on horizontal surfaces of the dielectric material in the vicinity of the at least one trench/via;

depositing copper in the at least one trench/via/via on the liner for filling the trench/via;

selectively recessing copper;

selectively electroplating a metal or alloy on the copper.

The present invention also relates to the products obtained by the above disclosed methods.

An even further aspect of the present invention relates to apparatus for etching or plating which comprises a wafer-holding fixture that permits wafers rotation and another fixture, substantially parallel to the first, which is segmented in right-shaped segments that can be electrically isolated from each other, and capable of ejecting the electrolyte in doughnut shaped flow regions of progressively increasing or decreasing internal diameter.

A still further aspect of the present invention relates to an apparatus for etching or plating comprising a wafer-holding fixture that permits wafers rotation and another ring-shaped fixture, substantially parallel to the first, whose area can be changed such that the electrochemical reactions on the wafer are localized.

Other objectives and advantages of the present invention will become readily apparent to those skilled in this art from the following detailed description, wherein it is shown and described only the preferred embodiments of the invention simply by way of illustration of the best mode contemplated of carrying out the invention. As will be realized, the invention is capable of other and different embodiments, and its several details are capable of modifications in various obvious respects, without departing from the invention. Accordingly, the description is to be regarded as illustrative in nature and not as restrictive.

BEST AND VARIOUS MODES FOR CARRYING OUT INVENTION

According to the present invention, copper in the presence of a liner material is selectively capped employing selective etching and/or selective electroplating. According to the present invention, the planarization process employed in a typical process to create a copper structure, such as a damascene or double damascene process, is stopped prior to removal of the liner material. According to the present invention the selective etching and/ selectively is carried out in the presence of the liner. This makes possible the elimination of bridging and shorts upon the subsequent removal of the liner.

Figure 1A:
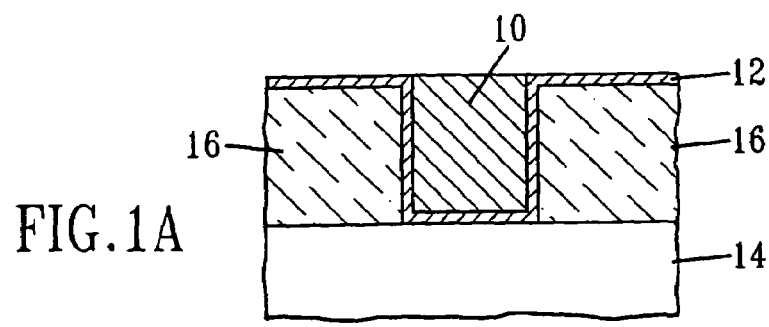
FIGS. 1A–1D illustrate a process sequence of the present invention employing selective etching.

As illustrated in FIG. 1A, for instance, the wafer surface is then planar and composed of two types of surfaces, the Cu surface 10 and the liner surface 12 (Ta, TaN, W, WN, and the like).

As will be discussed hereinbelow in detail, the copper surface is selectively etched and/or selectively plated with a capping material. In order to fabricate an understanding of the present invention, reference will be made to the frames.

As illustrated in FIG. 1A, copper wiring 10 is included on a semiconductor substrate 14 such as silicon, silicon-germanium alloys, and silicon carbide or gallium arsenate. The copper wiring 10 is electrically isolated by including a dielectric 16 such as silicon dioxide ($SiO_2$), phosphosilicate glass (PSG), boron doped PSG (BDPSG) or tetraethylorthosilicate (TEOS). In addition, the dielectric can include low dielectric constant material such as fluorinated $SiO_2$, organic polymers and porous dielectrics.

A liner or barrier layer 12 is employed along the bottom and sidewalls of the copper wiring 10 between the copper wiring 10 and dielectric 16. The liner 12 also is present on the horizontal surface of the dielectric 16 in the vicinity of the copper wiring 10.

Figure 1B:
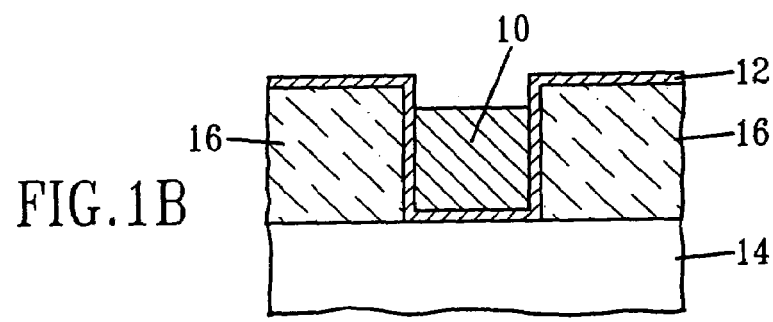

According to one aspect of the present invention, as shown in FIG. 1B, the copper 10 is selectively recessed by electroetching in the presence of the liner 12.

The liner 12 is typically Ta, TaN, W, WN or multiple layers of two or more of these materials.

Copper recessing in the presence of the liner 12 on the horizontal surfaces can be done without a mask by chemical etching, or by electrochemical etching with the latter preferably under electropolishing conditions. Chemical etching in the presence of a liner material exhibits an advantage as compared to the absence of a liner in that all features are at the same electrical potential thereby enhancing the uniformity of the chemical etching process. An example of a chemical etching process comprises using a solution containing about 0.5% vol. acetic acid and 0.3% vol. hydrogen peroxide. Initially the solution is primed by dissolving about 8–9 ppm (mg/l) of $Cu^{+2}$ in the bath and then the actual experimental parts are run. The solution is pumped at a rate of about 1 to about 10 liters/min and then sprayed unsubmerged onto the wafer. Typical dissolution rates are about 300 to about 1000 Angstroms/min of recessed copper. Electroetching is preferred since it has better selectivity. Cu can be electroetched preferentially to the typical liner materials such as Ta, TaN, W, WN, Ti and TiN. In contrast, chemical etching solutions, although suitable may not be as compatible universally with liner materials.

Figure 5A:
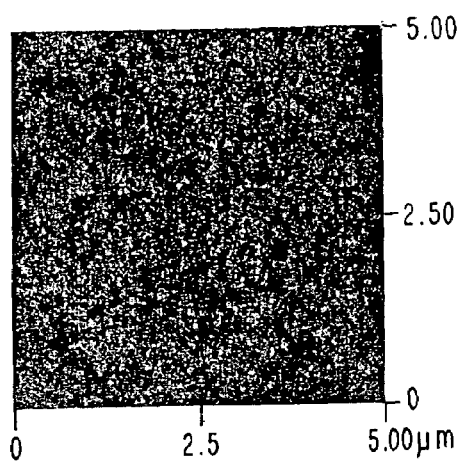
FIGS. 5A–5C are AFM images of Copper as plated (FIG. 5A) and electroetched under different conditions (FIGS. 5B and 5C).
Figure 5B:
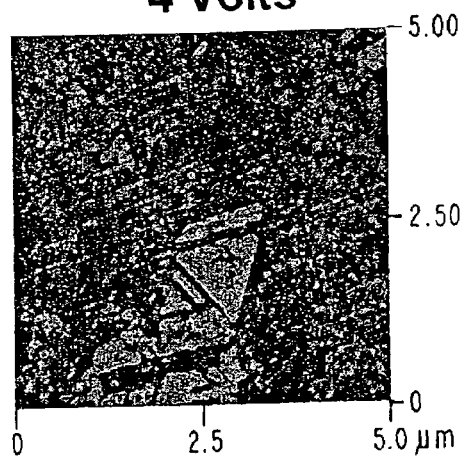
Figure 5C:
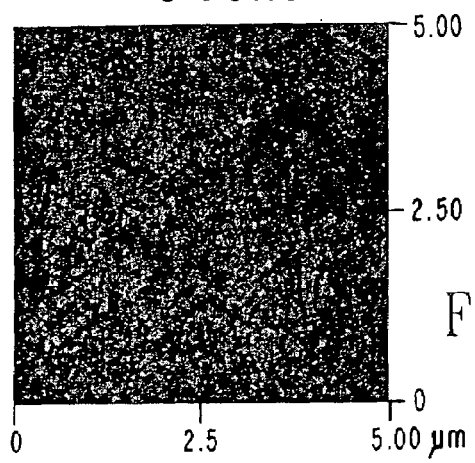
Figures 6A, 6B, 6C:
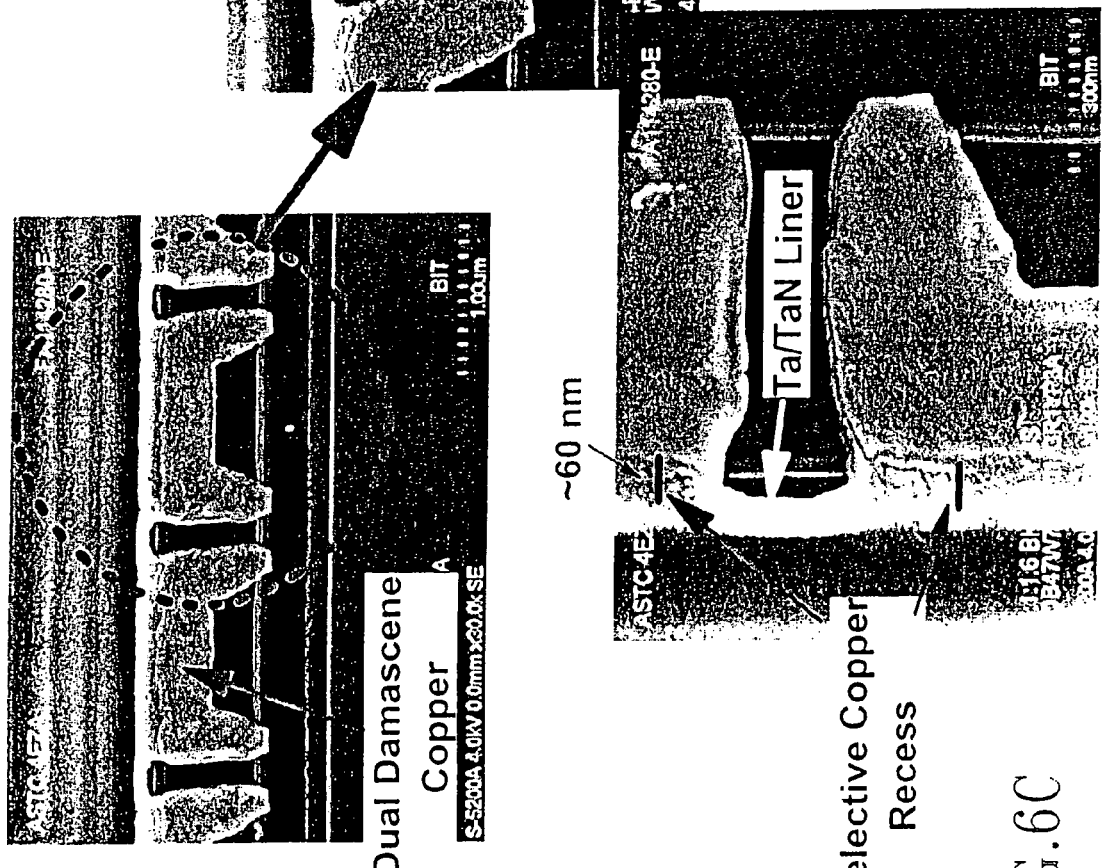
FIGS. 6A–6C are SEM cross sections of dual damascene structures with selectively electroetched copper.

Copper electroetching is preferably carried out under mass transport controlled—or electropolishing—conditions in order to improve wafer scale uniformity and to prevent crystallographic etching. Experiments carried out in concentrated phosphoric acid at different values of the applied voltage confirmed that at the higher voltages (6V), the onset of mass transport control causes the surface of the Cu to be flat in contrast to lower voltages (4V) where AFM analysis revealed the existence of considerable roughness resulting from crystallographic etching (FIG. 5A–5C). Removal of approximately 80 nm of Cu from 1–2 micron and 20–30 um features suggests that the thickness of the recessed Cu is independent of feature size, an attribute of paramount significance for any process aiming at recessing Cu in these types of applications. Cross sections of dual damascene Cu structures that have been electropolished under the conditions described above are shown in FIGS. 6A–6C.

Typical etching processing can employ as electrolyte, about 50%–100% $H_3PO_4$ and a voltage of about 1–20 volts. Typical etching parameters are disclosed in the table below.

Figure 1C:
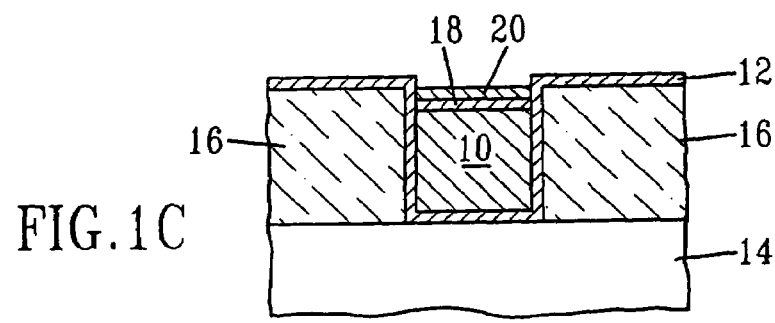

As illustrated in FIG. 1C, the capping or barrier layer(s) 18, 20 are selectively deposited by electroplating. The barrier layer does not electroplate on the liner and only on the copper. A typical electroplating process, using ruthenium as an example, employs a solution containing about 2 g/l of ruthenium prepared from nitrosylsulfate ruthenium salt and about 20 g/l $H_2SO_4$. Typical deposition temperatures are about 50° to about 70° C. and more typically about 60° to about 70° C. with a current efficiency of about 15 to about 30%. The current density is typically about 5 mA/cm² to about 100 mA/cm² and more typically about 10 mA/cm². The work piece(wafer) is typically rotated at about 50 to about 120 rpm, with about 90 rpm being preferred. The time varies depending upon the desired thickness, but is typically less than about 1000 seconds.

In another ruthenium electroplating example, a commercially available bath available under the trade designation "Ruthenex SP" from Enthone OMI is modified to contain about 4 g/l Ru to about 12 g/l Ru. In addition, the "Ruthenex SP" bath contains relatively large amounts of Mg salts and relatively small amounts of Ni. Mg deposits with the Ru metal and acts as a stress reducer. The conditions for the elctrodepositing with the baths containing Mg and/Ni are similar to those discussed above.

In a further example, Rh is deposited from a bath commercially available under the trade designation "Rhodex 100" from Enthone OMI. The bath contains about 4 g/l of Rh and a stress reducer additive. Rhodium is typically deposited at a current density of less than 10 mA/cm with current efficiencies of greater than about 30%. It is preferred to control the deposition rate to a current density in order to control deposit roughness.

Figure 7:
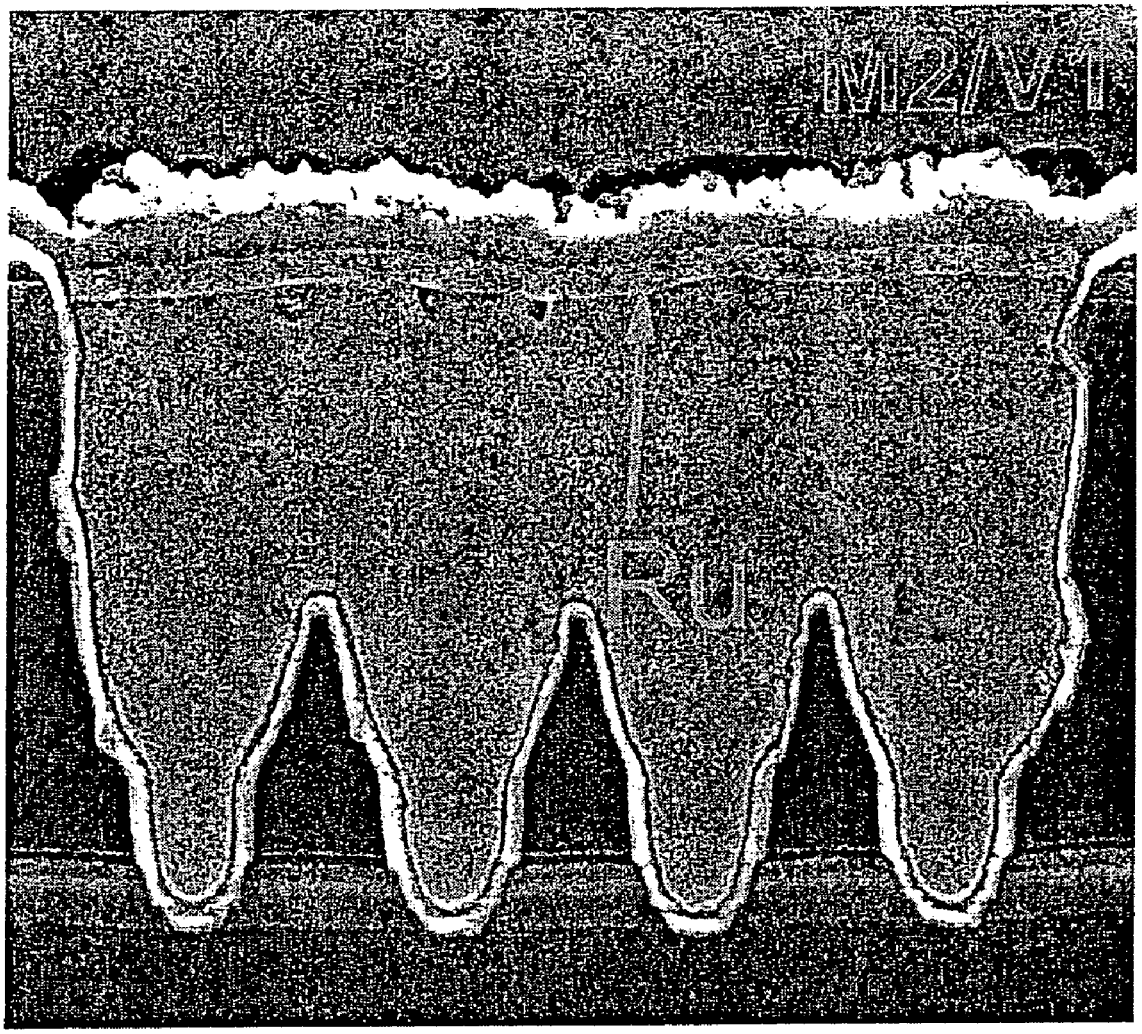
FIG. 7 is a SEM of a selectively electroplated ruthenium inside a selectively electropolished copper recess.

FIG. 7 shows a thin Ru layer that has been selectively electroplated on the recessed Cu. Ruthenium is an excellent barrier to Cu diffusion and at the same time noble enough to withstand the chemistry of the subsequent liner removal process such as CMP or RIE. In addition, prior to Ru deposition, an electromigration—suppressing CoWP layer can be deposited on the Cu by electrolytic plating, thereby forming a dual CoWP/Ru barrier.

Examples of other suitable metals or alloys employed as capping layers are Ta, TaN, TaSiN, W, WN, Co, COP, CoMoP, Ni, NiP, NiWP, NiMoP, NiW, NiMo, CoMo, NiFe, CoFe, NiFeP, CoFeP, NiB, CoB, NiFeB, CoFeB, NiCo, NiCoP, NiCoB, NiWvB, NiMoB, CoWB, CoMoB, CoV, NiV, CoFeV, NiFeV, NiCoV, NiCoFeV, NiCo, Ru, Re, Pt, Pd, Rh, Os, NiPd, CoPd, Pb, Sn, Sb, and In.

Some preferred structures according to the present invention include Cu conducting lines capped by a first metal or alloy selected from the group of Co, CoP, CoWP, CoMoP, Ni, NiP, NiWP, NiMoP, NiW, NiMo, CoMo, NiFe, CoFe, NiFeP, CoFeP, NiB, CoB, NiFeB, CoFeB, NiCo, NiCoP, NiCoB, NiWB, NiMoB, CoWB, CoMoB, CoV, NiV, CoFeV, NiFeV, NiCoV, NiCoFeV, NiCo and a second metal or alloy selected from the group of Ru, Re, Pt, Pd, Rh, Os, NiPd, CoPd, Pb, Sn, Sb, and In.

Figure 1D:
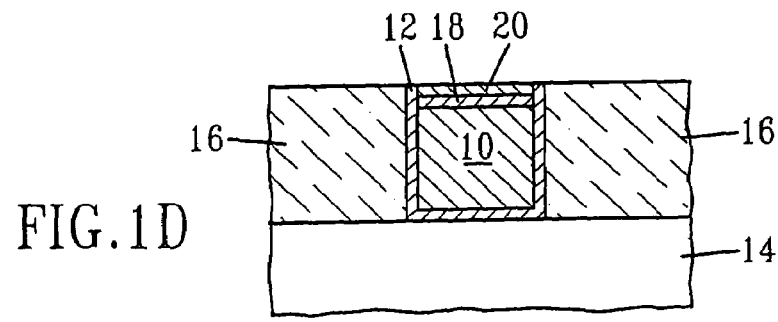

Next as shown in FIG. 1D, liner material 12 is removed from the horizontal surfaces on the dielectric 16 such as by chemical mechanical polishing, A typical CMP process includes polishing the liner with a slurry containing an oxidizer, an abrasive, surfactants and corrosion inhibitors such as described in U.S. Pat. No. 6,375,693, disclosure of which is incorporated herein by reference. The capping materials employed are selected so that they are not adversely affected by the chemical mechanical planarization process.

In an alternative process sequence, the capping is selectively deposited by electroless or exchange plating. According to the materials employed, after the copper 10 is recessed, the liner on the horizontal surfaces is removed such as by CMP and a seed layer, such as palladium or tin-palladium catalyst is deposited selectively on the copper 10, followed by the selective plating on the seeded surfaces. Selective seeding on the copper and avoidance of seeding on the dielectric can be achieved by rinsing with a solution containing a complexing agent, such as EDTA, or sodium citrate to remove any Pd ions adsorbed on the dielectric without removing the Pd metal on the copper surface as disclosed, for instance, in U.S. Pat. No. 6,503,834 B1, disclosure of which is incorporated herein by reference. For example, see column 3, lines 64 and 65 thereof. An example of an electroless deposition for ruthenium can be found in Ramani et al., "Synthesis and Characterization of Hydrous Ruthenium Oxide-Carbon Supercapacitor", J. Electrochem. Soc., 148 (4), A374–380 (2001), disclosure of which being incorporated herein by reference. For instance, a typical bath employed contains about 0.014 Molar ruthenium chloride, about 0.27 Molar sodium hypophosphite, about 0.014 Molar diammonium hydrogen citrate and about 0.07 Molar ammonium oxalate. The pH of the bath is typically maintained at about 9.5 by the periodic addition of sodium hydroxide and the temperature of the bath is typically kept about 90° C.

Figure 2A:
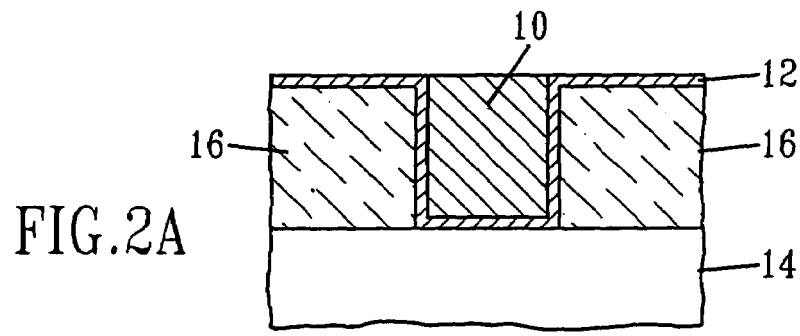
FIGS. 2A–2D illustrate an alternative sequence of the present invention employing selective etching.
Figure 2B:
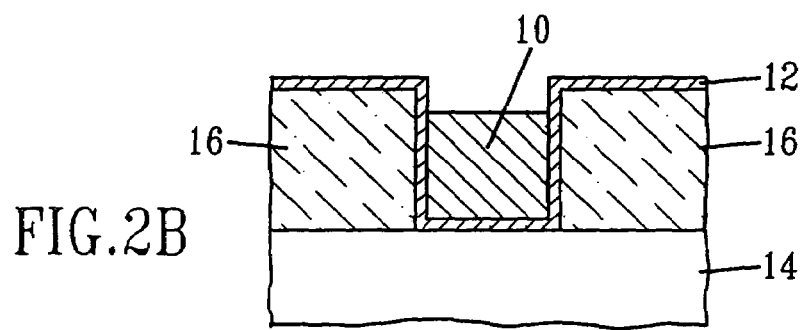
Figure 2C:
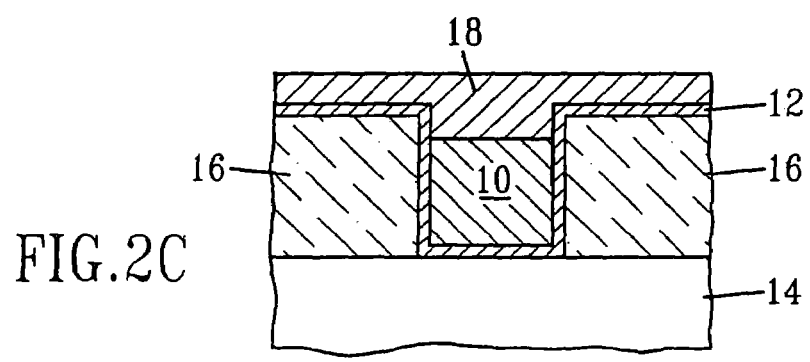
Figure 2D:
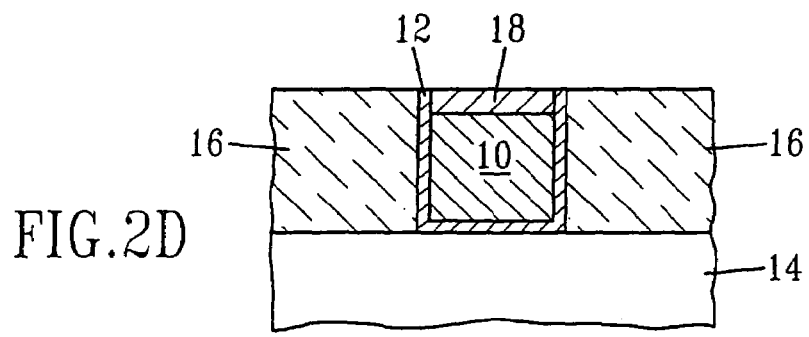
Figure 3A:
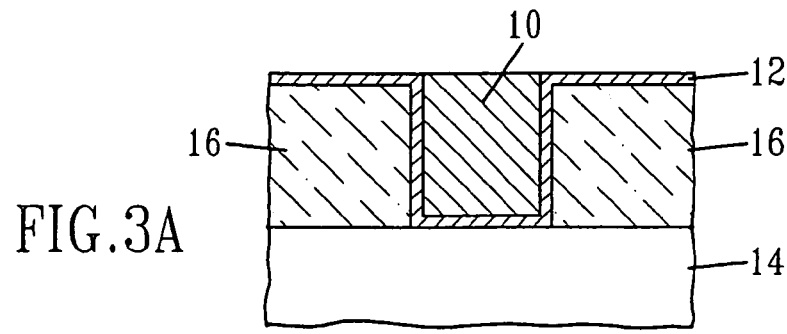
FIGS. 3A–3D illustrate an alternative sequence of the present invention employing selective etching.
Figure 3B:
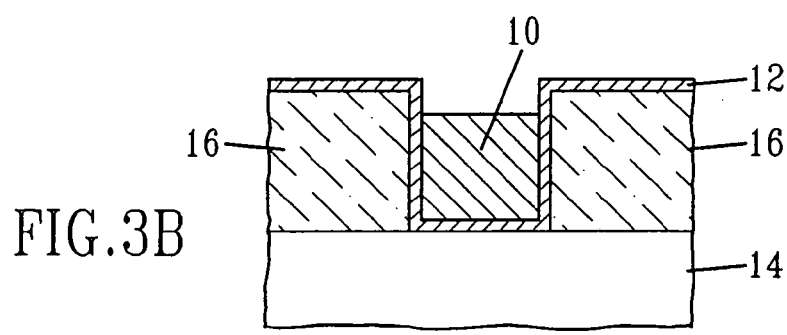
Figure 3C:
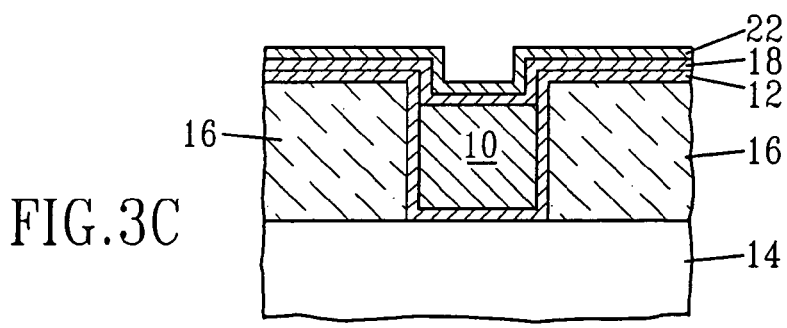

Reference to FIGS. 2A–2D illustrates another process sequence according to the present invention. FIGS. 2A and 2B parallel the sequence illustrated in FIGS. 1A and 1B as described above, resulting in the recessed upper structure shown in FIG. 2B. In FIG. 2C, a capping layer 18 is blanket deposited by electrolytic plating as described, for example, for the steps in FIG. 1C. As shown in FIG. 2D, layer 18 on the horizontal surfaces of dielectric 16 is removed such as by chemical mechanical polishing to electrical isolate the conductive lines. Also, as shown in FIG. 2D, the liner 12 on the horizontal surfaces of dielectric 16 is removed such as by chemical mechanical polishing Another sequence according to the present invention is shown in FIGS. 3A–3D. FIGS. 3A and 3B parallel the sequence illustrated in FIGS. 1A and 1B as disclosed above, resulting in the recessed copper structure shown in FIG. 3B. A capping layer 18 is blanket deposited which can be followed by metal, metal alloy or dielectric layer 22 (see FIG. 3C). Instead of electrolytic deposition, other deposition techniques seen as electroless plating, PVD and CVD can be employed.

Figure 3D:
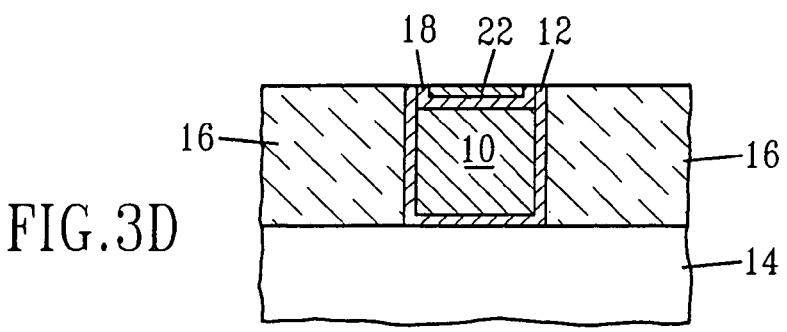

As shown in FIG. 3D, layer 18 and layer 22 can be removed from the horizontal surfaces of dielectric 16 such as by chemical mechanical polishing. Also, as shown in FIG. 3D, the liner 12 the horizontal surfaces of dielectric 16 is removed such as by chemical mechanical polishing.

Figure 4A:
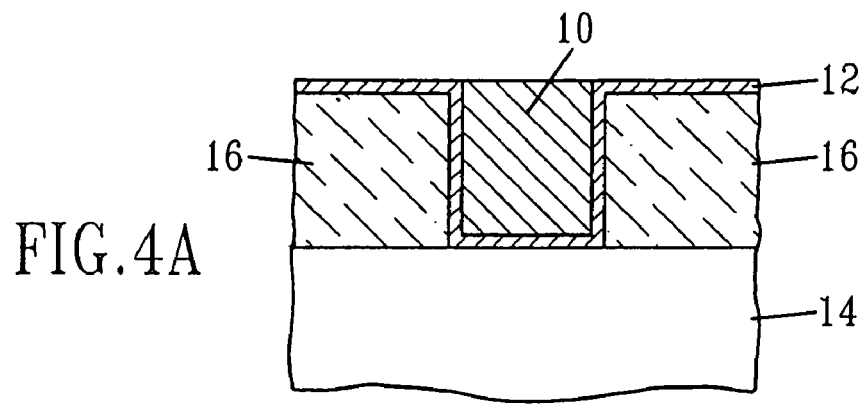
FIGS. 4A–4C illustrate process sequence of the present invention employing selective electroplating.
Figure 4B:
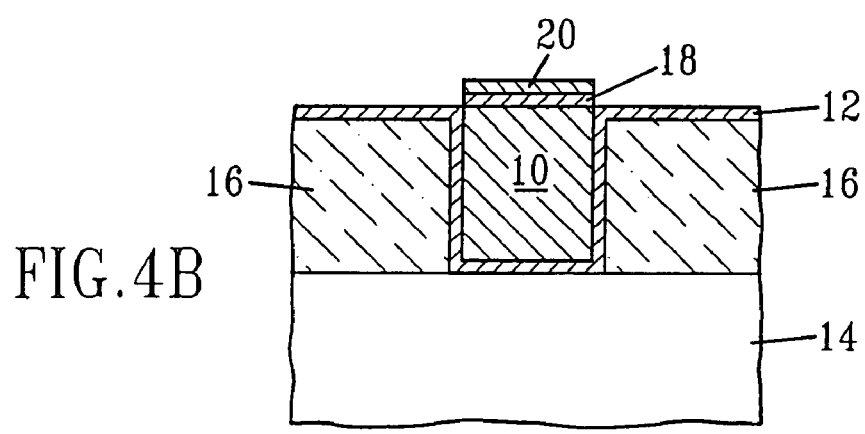
Figure 4C:
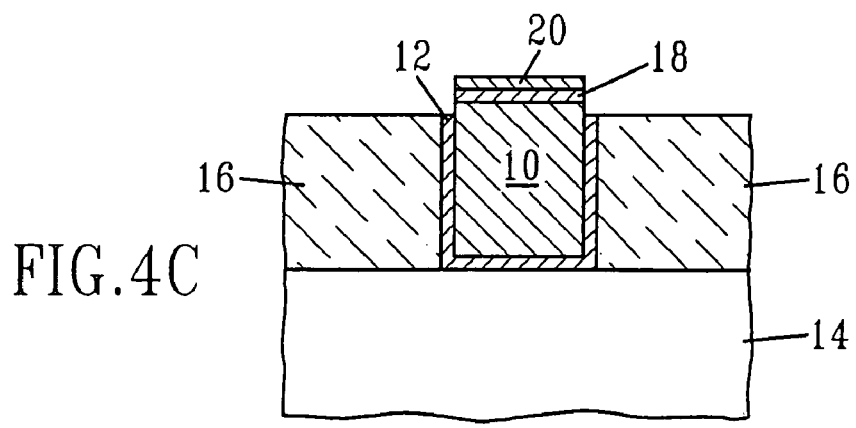

FIGS. 4A–4C illustrate a still further process according to the present invention. In FIG. 4A, a structure that parallels this structure of FIG. 1A disclosed above is obtained. Next, as illustrated in FIG. 4B, instead of depositing a blanket material, according to this aspect of the present invention, the wafer goes through an electrolytic step, where a material or plurality of materials 18, 20 is deposited selectively on the Cu surface but not on the liner surface. The plating process is designed to provide the desired selectivity. Preferably the liner material is Ta or W, or their nitrides, since these materials are quite resistant in electroplating thereon. Subsequent to the selective plating of the barrier layers 18, 20, as shown in FIG. 4C, the liner material is removed such as by a CMP or RIE process. An additional function of the top layer 20 of the barrier assembly in the various embodiments is to protect the rest of the assembly from the process used to remove the liner 12.

It is preferred that the total thickness of the barrier or capping assembly is at most about 10% of the thickness of the Cu conductor and typically at least about 50 angstroms and more typically about 50 angstroms to about 500 angstroms.

The preferred process of the present invention employ selective recessing of the copper such as illustrated in FIGS. 1B, 2B and 3B. In order to facilitate the integration it is preferred for the Cu conductor to be recessed with respect to the plane defined by the liner surface. In this manner, any material selectively deposited onto the Cu does not protrude.

It is apparent that the integration sequences described above are not limited to the fabrication of Cu interconnect structures. Any other device using Cu metallization and requiring recessing of the Cu can make use of the approaches described above. Such devices may include thick Cu inductors, capacitors whose metal plates are made of Cu, MEMS devices such as MEMS switches and MEMS resonators, and the like.

The electroetching according to the present invention was initially conducted in an apparatus described by Datta et al. in U.S. Pat. No. 5,486,282, equipped with a fountain-type nozzle having a width of about 10% of the wafer diameter and a length that is greater than the wafer diameter. The wafer (anode) was placed facing down over the fountain nozzle/cathode; inter electrode distance was filled with electrolyte (concentrated phosphoric acid). The potential was applied between the anode/wafer and the cathode/nozzle either in direct or pulsating form. As shown in Table 1 below, the amount of Cu recess can be controlled by such parameters as duty cycle of the applied voltage wave form and nozzle speed. However, the amount of recessed Cu at the center of the wafer was considerably less than the amount at the edge of the wafer. Accordingly, a preferred aspect of this invention is to overcome the 'terminal effect.'

| Electrolyte | Potential (volts) | Nozzle Speed (cm/sec) | Duty Cycle (%) | Copper Removal (ang) |
| --- | --- | --- | --- | --- |
| 80% $H_3PO_4$ | 6 | 0.2 | 100 | 7242 |
| 80% $H_3PO_4$ | 6 | 0.4 | 100 | 4444 |
| 80% $H_3PO_4$ | 6 | 0.8 | 100 | 2724 |
| 80% $H_3PO_4$ | 6 | 1.0 | 100 | 1489 |
| 80% $H_3PO_4$ | 6 | 2.0 | 100 | 1000 |
| 80% $H_3PO_4$ | 6 | 4.0 | 100 | 695 |
| 80% $H_3PO_4$ | 6 | 0.4 | 50 | 4156 |
| 80% $H_3PO_4$ | 6 | 0.8 | 70 | 2334 |
| 80% $H_3PO_4$ | 6 | 0.8 | 50 | 2287 |
| 80% $H_3PO_4$ | 6 | 0.8 | 25 | 2032 |
| 80% $H_3PO_4$ | 6 | 4.0 | 50 | 589 |
| 80% $H_3PO_4$ | 6 | 4.0 | 10 | 284 |
| 80% $H_3PO_4$ | 6 | 4.0 | 1 | 67 |

In both selective electroetching and electroplating processes described in this invention, the role of the liner is to distribute the current from the electrical contacts on the wafer periphery to all Cu surfaces on the wafer where these reactions occur. Because of the appreciable resistance of the liner the current is lower towards the center of the wafer; it has to cross an increasingly resistive path as it flows from the wafer edge inwards. This problem, called 'terminal effect,' is aggravated as the wafer size increases (e.g. from 200 mm to 300 mm) and as feature size decreases driving a decrease in the thickness, hence an increase in the resistance, of the liner.

Figure 8:
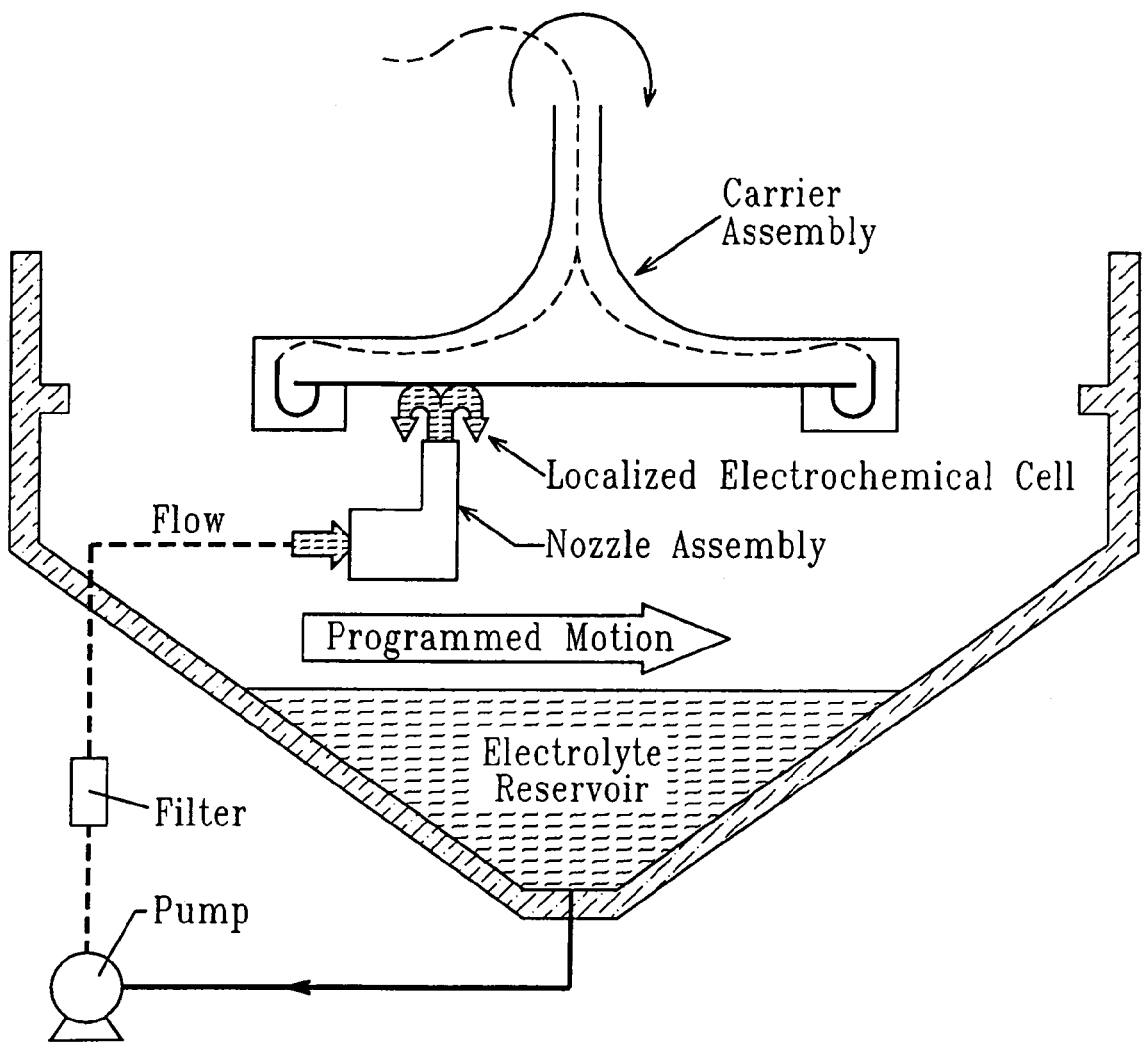
FIG. 8 is a schematic diagram of a tool suitable for selectively electroetching and backfilling of copper.

In order to circumvent the terminal effect, a few types of tools are preferred. In one, the nozzle used is circular and its diameter is considerably smaller than the diameter of the wafer (see FIG. 8). In this manner the overall current, and therefore the magnitude of the terminal effect is diminished. The tool can be used for electroetching as described in reference 6. In addition, it can also be used for electroplating of the barrier layers. It can also be used for etching and electroless plating where the terminal effect is however absent. There is a major difference between the plating and etching applications stemming from the fact that the former is done under constant current conditions whereas the latter is done using a constant potential difference between the wafer and the counter electrode. Under constant current conditions the movement of the nozzle need only be adjusted so that a constant amount of material is deposited on the wafer. Because of the diminishing liner resistance, the applied voltage decreases as the nozzle moves towards the periphery of the wafer. Since the changing value of the voltage does not affect the plating process, no compensatory action needs to be taken. If the tool operates as an etching tool under constant voltage, the effective voltage applied to the etching reaction decreases the farther away the nozzle moves from the wafer periphery. The movement of the nozzle must therefore be adjusted not only to take into account the changing wafer area but also the changing value of the effective potential applied.

Figure 9A:
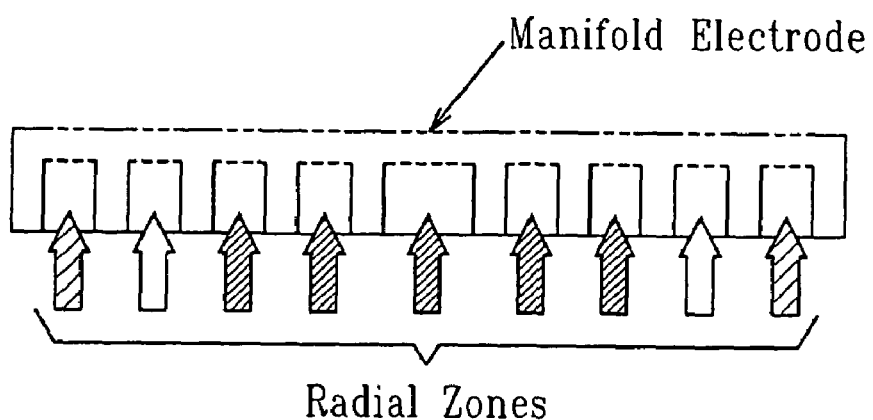
FIGS. 9A–9C are schematic diagrams of a manifold electrode used in the tool of FIG. 8.
Figure 9B:
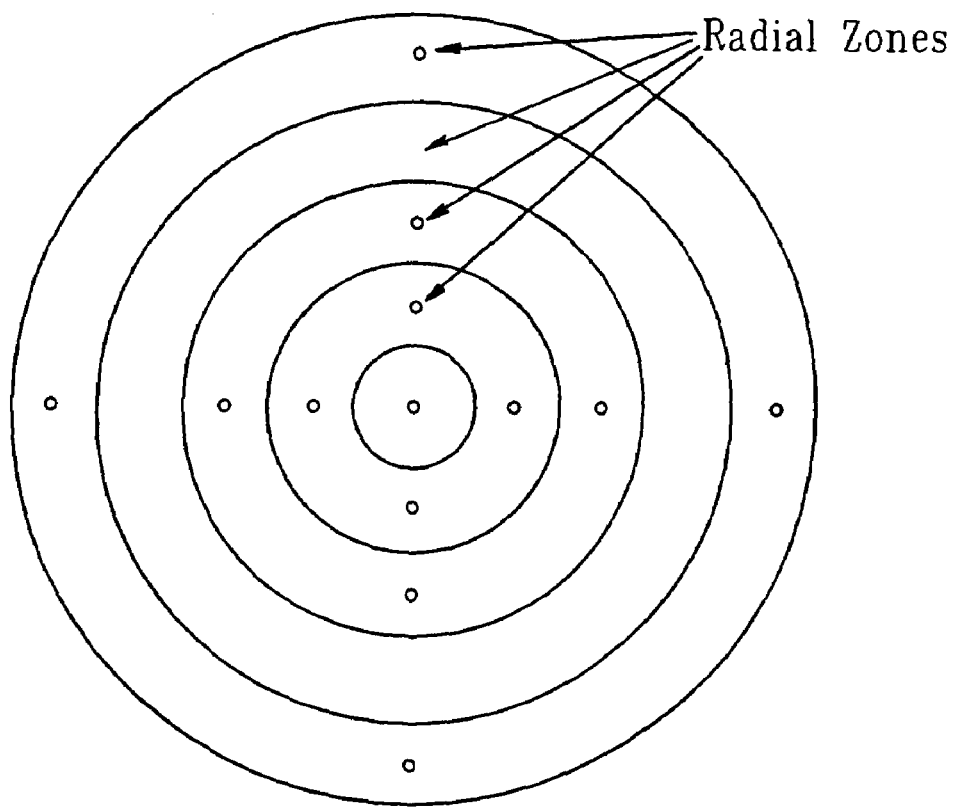
Figure 9C:
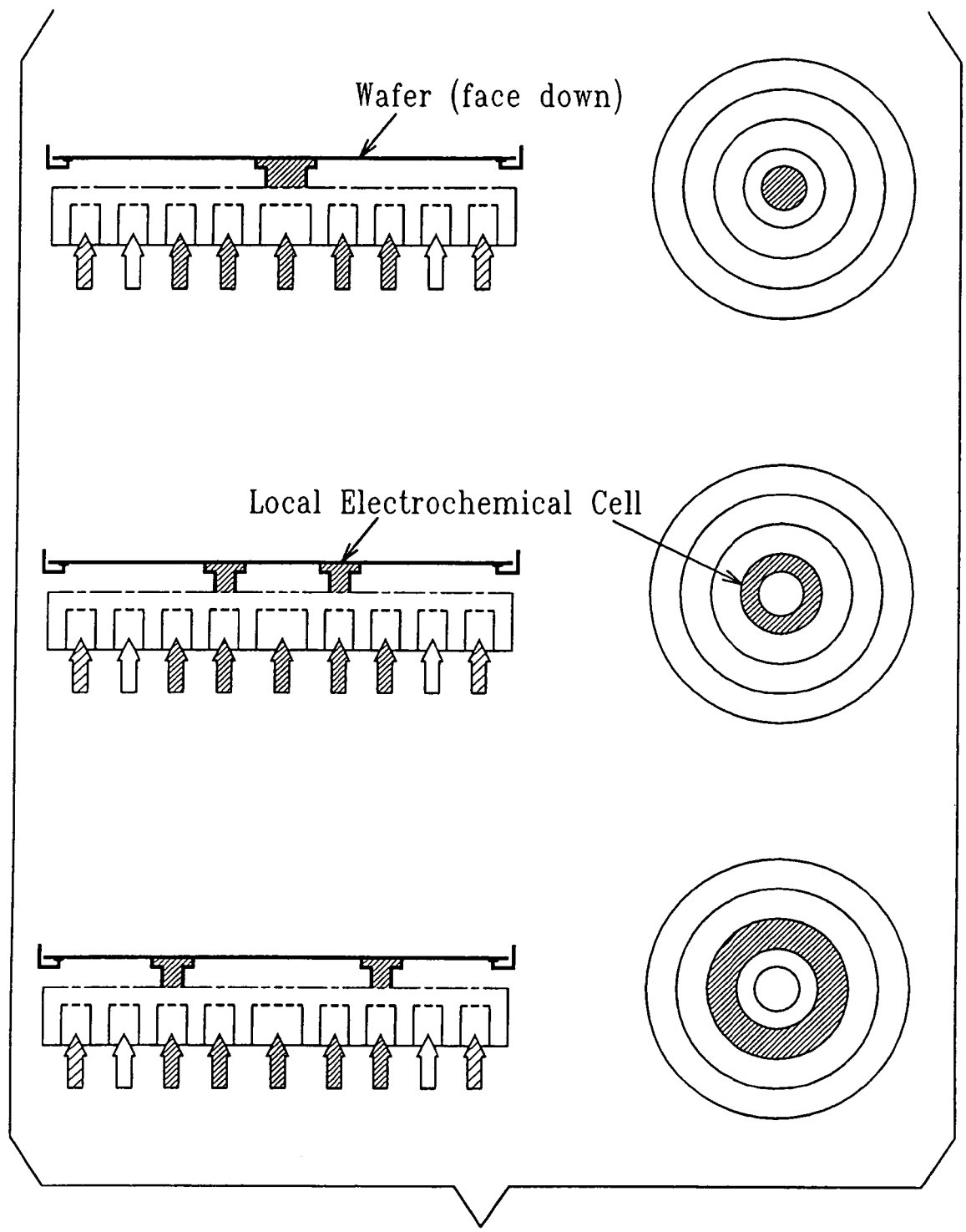

In another type of tool, the terminal effect can be overcome by segmenting the counter electrode and independently controlling each segment to give uniform deposition or etching. Electrolyte then can be supplied locally in a fountain type of flow between the electrodes forming an electrochemical cell only in the desired regions. One method of locally filling the inter-electrode gap would be to use a manifold type electrode illustrated in FIG. 9. FIG. 9a shows a cross section view of a manifold type counter electrode with radial compartments through which electrolyte can independently flow. FIG. 9b is a backside view illustrating the inlet ports for each of the zones. FIG. 9c illustrates localized flow forming an electrochemical cell only in the desired area which allows for radial control of deposition or etching either from center to edge or visa versa, resulting in wafer scale uniformity.

All publications and patent applications cited in this specification are herein incorporated by reference, and for any and all purposes, as if each individual publication or patent application were specifically and individually indicated to be incorporated by reference.

The foregoing description of the invention illustrates and describes the present invention. Additionally, the disclosure shows and describes only the preferred embodiments of the invention but, as mentioned above, it is to be understood that the invention is capable of use in various other combinations, modifications, and environments and is capable of changes or modifications within the scope of the invention concept as expressed herein, commensurate with the above teachings and/or the skill or knowledge of the relevant art. The embodiments described hereinabove are further intended to explain best modes known of practicing the invention and to enable others skilled in the art to utilize the invention in such, or other, embodiments and with the various modifications required by the particular applications or uses of the invention. Accordingly, the description is not intended to limit the invention to the form disclosed herein. Also, it is intended that the appended claims be construed to include alternative embodiments.

What is claimed as new and desired to be protected by Letters Patent of the United States is:

1. A patterned copper structure comprising a substrate having a dielectric material on the substrate wherein the dielectric material contains at least one trench/via therein;
   a liner located on the bottom and sidewalls of the at least one trench/via;
   copper located on the liner in the at least one trench/via; and a capping structure located on top of the copper and comprising a layer containing at least one member selected from the group consisting of ruthenium, rhenium, osmium, and rhodium, and wherein a layer containing CoWP is located directly on the copper between the copper and the layer containing the at least one member selected from the group consisting of ruthenium, rhenium, osmium, and rhodium.

2. The copper structure of claim 1 wherein the copper is recessed with respect to the upper surfaces of the dielectric.

3. The copper structure of claim 1 wherein the layer containing ruthenium is planar with or recessed with respect to the upper surface of the dielectric.

4. The copper structure of claim 1 wherein the at least one member comprises ruthenium and which further comprises a layer of dielectric located above the layer containing ruthenium.

5. The copper structure of claim 1 which further comprises a layer of dielectric located above the layer containing at least one member selected from the group consisting of ruthenium, rhenium, osmium, and rhodium.

6. A patterned copper structure comprising a substrate having a dielectric material on the substrate wherein the dielectric material contains at least one trench/via therein;
   a liner located on the bottom and sidewalls of the at least one trench/via;
   copper located on the liner in the at least one trench/via; and a capping structure located directly on top of the copper and compressing a first metal or alloy layer selected from the group consisting of Co, CoP, CoWP, CoMoP, Ni, NiP, NiWP, NiMoP, NiW, NiMo, CoMo, NiFe, CoFe, NiFeP, NiB, CoB, NiFeB, CoFeB, NiCo, NiCoP, NiCoB, NiWB, NiMoB, CoWB, CoMoB, CoV, NiV, CoFeV, NiFeV, NiCoV, NiCoFeV and NiCo; and In, and
   a second metal or alloy layer selected from the group consisting of Ru, Re, Pt, Pd, Rh, Os, NiPd, CoPd, Pb, Sn, Sb, and
   wherein the first metal or alloy layer is located between the copper and the second metal or alloy layer.

7. The copper structure of claim 6 wherein the copper is recessed with respect to the upper surfaces of the dielectric.

8. The copper structure of claim 7 which said second metal or alloy layer is planar with or recessed with respect to the upper surface of the dielectric.

9. The copper structure of claim 6 wherein further comprises a layer of dielectric located above the second metal or alloy layer.

* * * * *